United States Patent [19]

Crook

[11] Patent Number: 4,633,151
[45] Date of Patent: Dec. 30, 1986

[54] SERIES CONNECTED TRANSISTOR PROTECTION CIRCUIT

[75] Inventor: James C. Crook, Raleigh, N.C.

[73] Assignee: Kollmorgen Technologies Corporation, Dallas, Tex.

[21] Appl. No.: 664,300

[22] Filed: Oct. 24, 1984

Related U.S. Application Data

[63] Continuation-in-part of Ser. No. 547,637, Nov. 1, 1983, abandoned.

[51] Int. Cl.⁴ ............................................. H02K 29/06
[52] U.S. Cl. ..................................... 318/254; 318/138; 318/439; 363/56
[58] Field of Search ..................... 318/138, 254 A, 254, 318/439, 434, 696; 363/55, 56, 57, 58, 98

[56] References Cited

U.S. PATENT DOCUMENTS

| | | | |
|---|---|---|---|
| 4,300,085 | 11/1981 | Monma et al. | 318/696 |
| 4,368,411 | 1/1983 | Kidd | 318/254 |
| 4,479,078 | 10/1984 | Kidd et al. | 318/254 |
| 4,532,461 | 7/1985 | Crook | 318/254 |

FOREIGN PATENT DOCUMENTS 55-26064  2/1980  Japan ................................. 318/254

Primary Examiner—William M. Shoop, Jr.
Assistant Examiner—Bentsu Ro
Attorney, Agent, or Firm—Morgan & Finnegan

[57] ABSTRACT

In a motor control system of the type having a plurality of transistors connected in series between a power supply and ground, a protection circuit is utilized to prevent the transistors from turning on simultaneously. The protection circuit introduces time delay into the turn on signals applied to the bases of the serially connected transistors, thereby preventing simultaneous operation and preventing excessive currents from damaging the transistors.

9 Claims, 4 Drawing Figures

4,633,151

SERIES CONNECTED TRANSISTOR PROTECTION CIRCUIT

This application is a continuation-in-part application of patent application Ser. No. 547,637 filed Nov. 1, 1983, now abandoned.

BACKGROUND OF THE INVENTION

The present invention relates generally to protection of transistors connected in a switching bridge configuration and more specifically to protection for the series connected transistors therein.

Transistors connected in series between terminals of a power supply are often found in switching bridge control systems for brushless DC motors. Typically, brushless motors are constructed with stationary windings and a rotating permanent magnetic field. The windings are commutated by the operating transistor pairs which are controlled in response to signals from rotor position sensors. Since the brushes and commutator of the normal DC motor are eliminated, and since commutation is controlled by the series connected transistors, brushless motors require sophisticated electronic motor control systems. A representative example of a DC motor having an electronic control system is disclosed in U.S. Pat. No. 4,368,411, entitled "Control System For Electric Motor", issued Jan. 11, 1983, to H. Keith Kidd.

In brushless motor circuits there are typically six transistors connected in a bridge configuration of three pairs of series connected transistors which are connected between terminals of a power supply. The series connected transistors should never be turned on together, since simultaneous operation causes a short circuit across the power supply. Bipolar transistors have a time delay between the time that they are commanded to turn off and the time that they actually do turn off. This time delay is caused by the charge stored in the base-emitter junction of the transistor. The time delay is commonly referred to as the storage time of the transistor. The turn on time of the transistor is generally much shorter than the turn-off time because of the storage time. If a series connected pair of transistors is switched rapidly from the state where one transistor is on to the state where the other transistor is on, the difference between storage time of the transistor being turned off and the turn-on time of the transistor being turned on will cause both transistors to be on for the period of the time difference, resulting in excessive currents which can damage the transistors.

An object of the present invention is to provide a protection circuit for such series connected transistor pairs.

Another object of the present invention is to provide a motor control circuit in which time delays are introduced where needed to prevent excessive currents and consequent damage to the series connected transistor pairs.

SUMMARY OF THE INVENTION

The present invention provides a protection circuit for transistors connected in series within a switching bridge configuration. The switching transistors typically include two transistors connected in series across the terminals of a power supply.

In a control system for a brushless DC motor, the protection circuit of the present invention can be used to protect the series connected transistor pairs in the switching bridge used to commutate the stator windings. As the motor rotates, position signals are generated which the motor controller utilizes to provide synchronous control signals to the switching bridge. The protection circuit compares the present state of the control signals to their previous state to detect dangerous switching transitions. The transistor pair protection circuit according to the invention introduces time delays where needed to prevent the simultaneous operation of a series connected pair of transistors.

DETAILED DESCRIPTION OF THE PREFERRED EMBODIMENT

Figure 1:
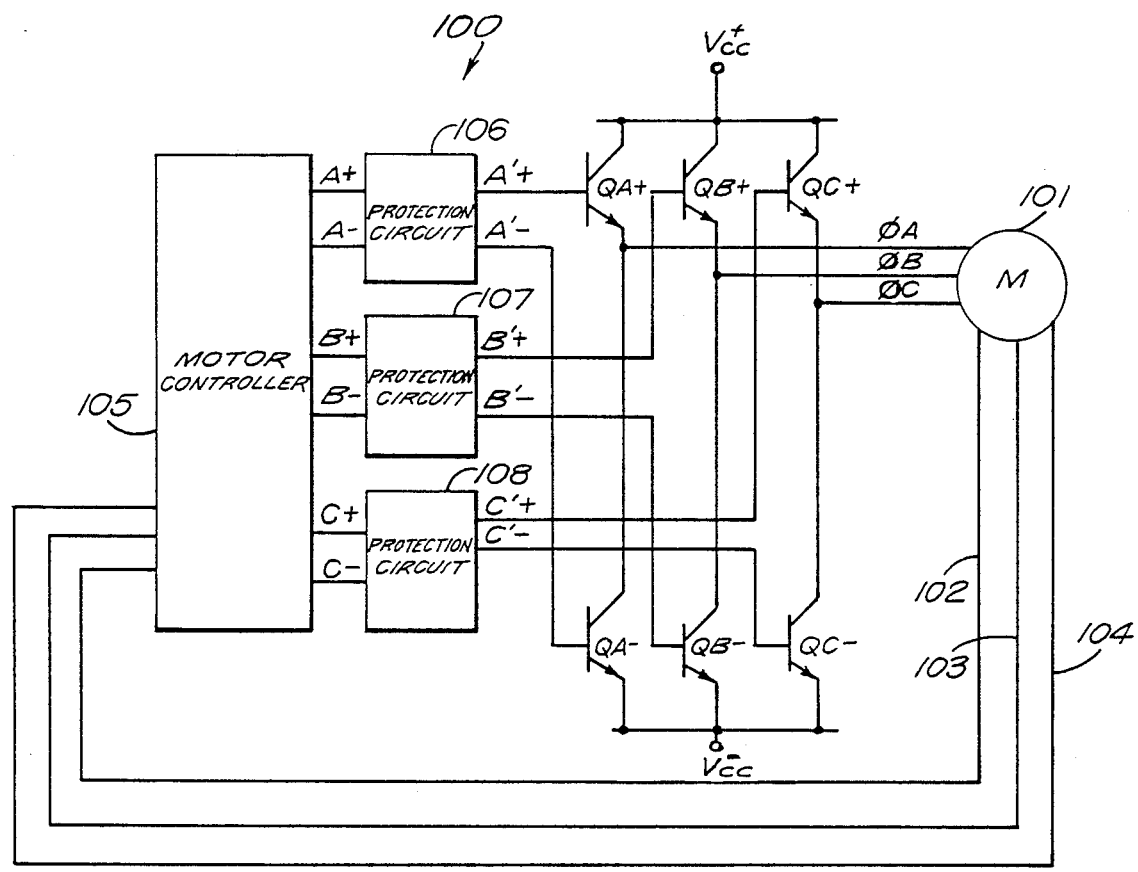
FIG. 1 is a schematic block diagram of a motor control system utilizing the apparatus of the present invention.

FIG. 1 is a schematic block diagram of a control system 100 for an electric motor 101 according to the present invention. The present invention in its broadest aspects is not limited to motor control systems. Although the present invention is described herein in conjunction with a brushless DC electric motor, it is equally applicable to other inverters using switching bridge configurations which have series connected transistor pairs across the power supply terminals.

Motor 101 is preferably a brushless DC electric motor including a permanently magnetized rotor and a three phase stator winding excited by currents supplied on lines designated $\phi A$, $\phi B$, $\phi C$. Position signals from position sensors disposed in an operative relationship to the rotor provide position signals on lines 102, 103 and 104 to a motor controller 105. The motor controller includes a plurality of transistors $Q_{A+}$, $Q_{A-}$, $Q_{B+}$, $Q_{B-}$, $Q_{C+}$, $Q_{C-}$ forming a six transistor switching bridge connected between terminals of a power supply $V_{cc}$. The motor controller may be of the type disclosed in U.S. Pat. No. 4,368,411. Series connected transistor pair protection circuits 106, 107, and 108 are coupled between the motor controller 105 and its associated transistors $Q_{A+}$, $Q_{A-}$, $Q_{B+}$, $Q_{B-}$, $Q_{C+}$, $Q_{C-}$.

The collector of transistor $Q_{A+}$ is connected to the positive terminal of a voltage supply designated $V_{CC}$. The base of transistor $Q_{A+}$ is connected to an output terminal of the series protection circuit designated $A'+$. The emitter of transistor $Q_{A+}$ is connected to line $\phi A$ and the collector of the transistor $Q_{A-}$. The base of transistor $Q_{A-}$ is connected to the other output terminal of the series protection circuit 106 designated $A'-$. The emitter of transistor $Q_{A-}$ is connected to the negative terminal of the voltage supply $V_{CC}$. The series connected pairs of transistors $Q_{B+},Q_{B-}$ and $Q_{C+},Q_{C-}$ are connected to series protection circuits 107 and 108 in a similiar fashion. For purposes of simplicity, only the series connected transistor pair $Q_{A+},Q_{A-}$ and series connected transistor pair protection circuit 106 will be described in detail, but the description is applicable to the other series connected transistors $Q_{B+}$, $Q_{B-}$, and $Q_{C+}$, $Q_{C-}$ and their respective series connected transistor pair protection circuits 107 and 108.

Figure 3:
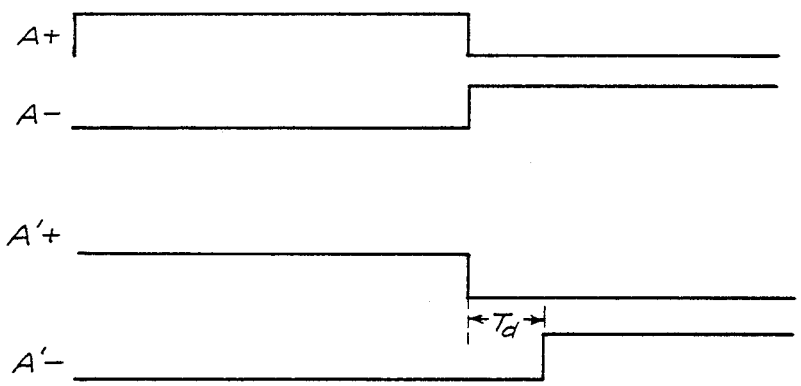
FIGS. 3 and 4 are illustrations of waveforms useful in explaining the operation of the present invention.
Figure 4:
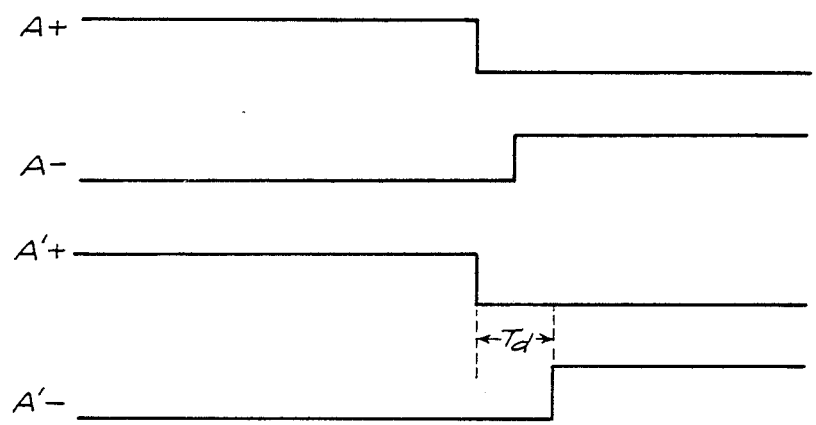

Controller 105 provides output signals designated $A+,A-$ which are useful for turning on transistors $Q_{A+}, Q_{A-}$. If the controller is simply providing output signals which successively turn transistor $Q_{A+}$ on and off in a pulse width modulating fashion, for example, there is no danger that there will be simultaneous operation of transistors $Q_{A+}, Q_{A-}$. If the controller 105, however, has to make a transition from the state in which transistor $Q_{A+}$ is on and transister $Q_{A-}$ is off to a state in which transistor $Q_{A-}$ is on and transistor $Q_{A+}$ is off. As illustrated in the first set of waveforms A+, A− of FIG. 3, the charge stored in the base-emitter junction of transistor $Q_{A+}$ causes both transistors to be turned on for a period of time causing a short circuit across the voltage supply $V_{CC}$, thereby causing damage to the transistors. This simultaneous turning on is avoided by introducing a time delay $t_d$ into the output from the protection circuit as shown in the second set of waveforms A'+, A'− of FIG. 3. When there is a transition from turning on transistor $Q_{A-}$ to turning on transistor $Q_{A+}$ the same short circuiting also results unless there is a time delay as illustrated in FIG. 4. The series connected pair transistor protection circuit 106, therefore, prevents such damage, by introducing time delays $t_d$ in the signals A'+, A'− whenever a transition is detected where one of the transistors $Q_{A+}$ and $Q_{A-}$ is turned on before the other has completely turned off.

Figure 2:
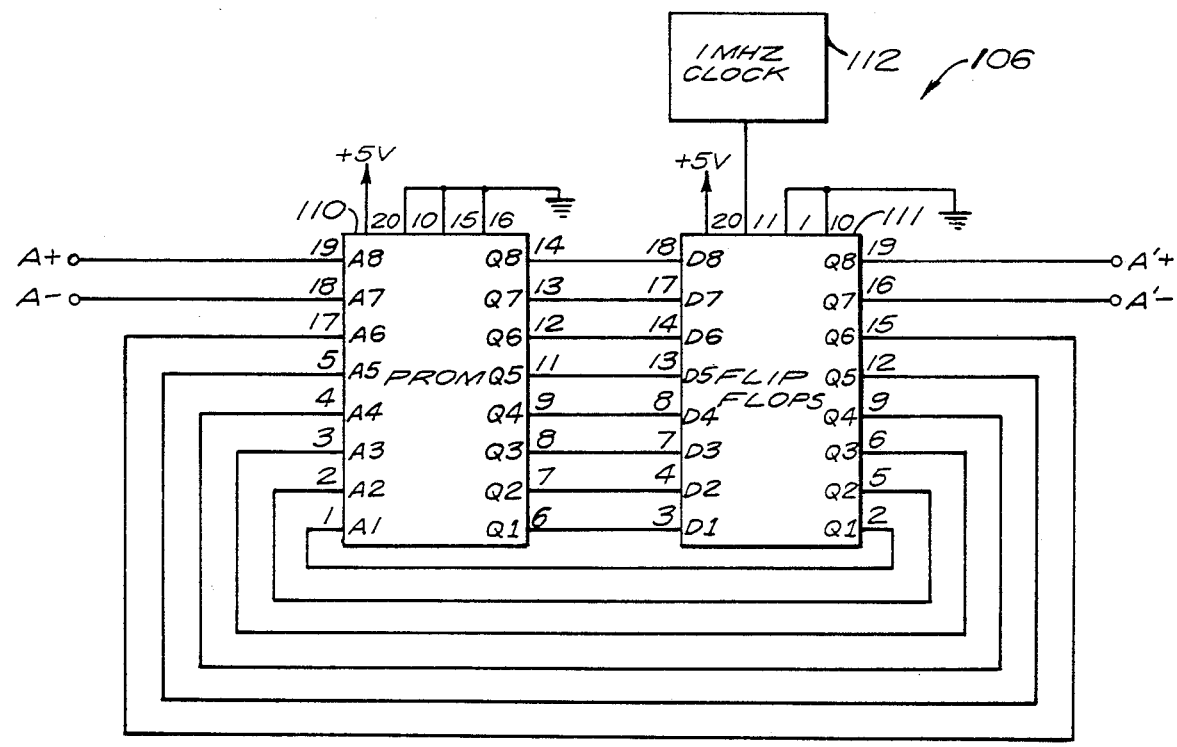
FIG. 2 is a schematic block diagram of the series connected transistor pair protection circuit of FIG. 1.

FIG. 2 is a schematic block diagram which depicts the series connected protection circuit 106 of FIG. 1. The hardware necessary to detect a transition in input signals A+, A− as well as introducing time delays into output signals A'+, A'− includes a read-only memory (PROM) 110, a plurality of flip flop latch circuits 111, and a 1 mhz clock 112. Preferably the flip flops or latch circuits 111 consist of an integrated circuit available from commercial sources under device number 74LS374.

PROM 110 is an eight bit addressable read only memory capable of storing 256 bytes of data at the addressable locations. The PROM is addressed by binary signals applied to the eight address inputs A1 to A8, bit A8 being the most significant bit. The output of the PROM appears as an eight bit word on the output terminals Q1 to Q8, bit Q8 being the most significant output bit.

Latch circuits 111 includes eight flip flop circuit each connected to receive its input control signal from a different one of data input terminals D1 to D8 and provide signals at output terminals Q1 to Q8, respectively, in accordance with the state of the flip flop circuit. Clock 112 provides clock pulses to the latch circuits 111. The occurrence of a clock pulse causes the respective flip flop circuits to assume a state corresponding to the input signals at terminals D1 to D8, and hence, the same signals thereafter appear at the output terminals Q1 to Q8. In the period between clock pulses, changes in the signals applied to the data input terminals have no effect on the states of the flip flop circuits. Thus, a clock pulse transfers the eight bit binary word appearing at input terminals D1 to D8 to the output terminals Q1 to Q8 and thereafter maintaining those output signals until occurrence of the next clock pulse.

The signals A+ and A− from motor controller 105 (FIG. 1) are supplied to input terminals A8 and A7, respectively, of PROM 110. Output terminals Q8 and Q7 of latch circuits 111, respectively, supply the signals A'+ and A'− for controlling series transistors QA+ and QA− in the switching lo bridge. Outputs Q1 to Q6 of latch circuits 111 are connected to address inputs A1 to A6, respectively of PROM 110. PROM outputs Q1 to Q8 are connected, respectively to data inputs D1 to D8 of latch circuits 111.

The data stored in the PROM is as shown in Table I. The addresses (A8 to A1), in hexadecimal form, are to the right of the vertical lines and the corresponding stored values which appear at PROM outputs Q8 to Q1 are to the left of the vertical lines and are also indicated in the hexadecimal form.

TABLE I

| ADDR | PROM |
|------|------|
| 00 | 00 |
| 01 | 1F |
| 02 | 2F |
| 03 | 00 |
| 04 | 03 |
| 05 | 04 |
| 06 | 05 |
| 07 | 06 |
| 08 | 07 |
| 09 | 08 |
| 0A | 09 |
| 0B | 0A |
| 0C | 0B |
| 0D | 0C |
| 0E | 0D |
| 0F | 0E |
| 10 | 00 |
| 11 | 10 |
| 12 | 11 |
| 13 | 12 |
| 14 | 13 |
| 15 | 14 |
| 16 | 15 |
| 17 | 16 |
| 18 | 17 |
| 19 | 18 |
| 1A | 19 |
| 1B | 1A |
| 1C | 1B |
| 1D | 1C |
| 1E | 1D |
| 1F | 1E |
| 20 | 00 |
| 21 | 20 |
| 22 | 21 |
| 23 | 22 |
| 24 | 23 |
| 25 | 24 |
| 26 | 25 |
| 27 | 26 |
| 28 | 27 |
| 29 | 28 |
| 2A | 29 |
| 2B | 2A |
| 2C | 2B |
| 2D | 2C |
| 2E | 2D |
| 2F | 2E |
| 30 | 0F |
| 31 | 30 |
| 32 | 31 |
| 33 | '32 |
| 32 | 32 |
| 35 | 32 |
| 36 | 32 |
| 37 | 32 |
| 38 | 32 |
| 39 | 32 |
| 3A | 32 |
| 3B | 32 |
| 3C | 32 |
| 3D | 32 |
| 3E | 32 |
| 3F | 32 |
| 40 | 01 |
| 41 | 41 |
| 42 | 2F |
| 42 | 01 |
| 44 | 02 |
| 45 | 03 |
| 46 | 04 |

TABLE I-continued

| ADDR | PROM |
|------|------|
| 47 | 05 |
| 48 | 06 |
| 49 | 07 |
| 4A | 08 |
| 4B | 09 |
| 4C | 0A |
| 4D | 0B |
| 4E | 0C |
| 4F | 0D |
| 50 | 0E |
| 51 | 01 |
| 52 | 01 |
| 53 | 01 |
| 54 | 01 |
| 55 | 01 |
| 56 | 01 |
| 57 | 01 |
| 58 | 01 |
| 59 | 01 |
| 5A | 01 |
| 5B | 01 |
| 5C | 01 |
| 5D | 01 |
| 5E | 01 |
| 5F | 01 |
| 60 | 01 |
| 61 | 20 |
| 62 | 21 |
| 63 | 22 |
| 64 | 23 |
| 65 | 24 |
| 66 | 25 |
| 67 | 26 |
| 68 | 27 |
| 69 | 28 |
| 6A | 29 |
| 6B | 2A |
| 6C | 2B |
| 6D | 2C |
| 6E | 2D |
| 6F | 2E |
| 70 | 0F |
| 71 | 30 |
| 72 | 31 |
| 73 | 32 |
| 74 | 32 |
| 75 | 32 |
| 76 | 32 |
| 77 | 32 |
| 78 | 32 |
| 79 | 32 |
| 7A | 32 |
| 7B | 32 |
| 7C | 32 |
| 7D | 32 |
| 7E | 32 |
| 7F | 32 |
| 80 | 02 |
| 81 | 1F |
| 82 | 82 |
| 83 | 02 |
| 84 | 03 |
| 85 | 04 |
| 86 | 05 |
| 87 | 06 |
| 88 | 07 |
| 89 | 08 |
| 8A | 09 |
| 8B | 0A |
| 8C | 0B |
| 8D | 0C |
| 8E | 0D |
| 8F | 0E |
| 90 | 02 |
| 91 | 10 |
| 92 | 11 |
| 93 | 12 |
| 94 | 13 |
| 95 | 14 |
| 96 | 15 |
| 97 | 16 |

TABLE I-continued

| ADDR | PROM |
|------|------|
| 98 | 17 |
| 99 | 18 |
| 9A | 19 |
| 9B | 1A |
| 9C | 1B |
| 9D | 1C |
| 9E | 1D |
| 9F | 1E |
| A0 | 02 |
| A1 | 02 |
| A2 | 02 |
| A3 | 02 |
| A4 | 02 |
| A5 | 02 |
| A6 | 02 |
| A7 | 02 |
| A8 | 02 |
| A9 | 02 |
| AA | 02 |
| AB | 02 |
| AC | 02 |
| AD | 02 |
| AE | 02 |
| AF | 02 |
| B0 | 0F |
| B1 | 30 |
| B2 | 31 |
| B3 | 32 |
| B4 | 32 |
| B5 | 32 |
| B6 | 32 |
| B7 | 32 |
| B8 | 32 |
| B9 | 32 |
| BA | 32 |
| BB | 32 |
| BC | 32 |
| BD | 32 |
| BE | 32 |
| BF | 32 |
| C0 | 32 |
| C1 | 32 |
| C2 | 32 |
| C3 | 32 |
| C4 | 32 |
| C5 | 32 |
| C6 | 32 |
| C7 | 32 |
| C8 | 32 |
| C9 | 32 |
| CA | 32 |
| CB | 32 |
| CC | 32 |
| CD | 32 |
| CE | 32 |
| CF | 32 |
| D0 | 32 |
| D1 | 32 |
| D2 | 32 |
| D3 | 32 |
| D4 | 32 |
| D5 | 32 |
| D6 | 32 |
| D7 | 32 |
| D8 | 32 |
| D9 | 32 |
| DA | 32 |
| DB | 32 |
| DC | 32 |
| DD | 32 |
| DE | 32 |
| DF | 32 |
| E0 | 32 |
| E1 | 32 |
| E2 | 32 |
| E3 | 32 |
| E4 | 32 |
| E5 | 32 |
| E6 | 32 |
| E7 | 32 |
| E8 | 32 |

TABLE I-continued

| ADDR | PROM |
|---|---|
| E9 | 32 |
| EA | 32 |
| EB | 32 |
| EC | 32 |
| ED | 32 |
| EE | 32 |
| EF | 32 |
| F0 | 32 |
| F1 | 32 |
| F2 | 32 |
| F3 | 32 |
| F4 | 32 |
| F5 | 32 |
| F6 | 32 |
| F7 | 32 |
| F8 | 32 |
| F9 | 32 |
| FA | 32 |
| FB | 32 |
| FC | 32 |
| FD | 32 |
| FE | 32 |
| FF | 32 |

The operation of the system according to the invention can best be understood by reference to Tables IIA, IIB and IIC which correspond to portions of Table I giving both the hexadecimal values and the binary values.

TABLE II

| | A8 | A7 | A6 | A5 | A4 | A3 | A2 | A1 | | Q8 | Q7 | Q6 | Q5 | Q4 | Q3 | Q2 | Q1 |
|---|---|---|---|---|---|---|---|---|---|---|---|---|---|---|---|---|---|
| | | | | | | CONTROL STATE "00" | | | | | | | | | | | |
| 00 | 0 | 0 | 0 | 0 | 0 | 0 | 0 | 0 | 00 | 0 | 0 | 0 | 0 | 0 | 0 | 0 | 0 |
| 01 | 0 | 0 | 0 | 0 | 0 | 0 | 0 | 1 | 1F | 0 | 0 | 0 | 1 | 1 | 1 | 1 | 1 |
| 02 | 0 | 0 | 0 | 0 | 0 | 0 | 1 | 0 | 2F | 0 | 0 | 1 | 0 | 1 | 1 | 1 | 1 |
| 03 | 0 | 0 | 0 | 0 | 0 | 0 | 1 | 1 | 00 | 0 | 0 | 0 | 0 | 0 | 0 | 0 | 0 |
| 04 | 0 | 0 | 0 | 0 | 0 | 1 | 0 | 0 | 03 | 0 | 0 | 0 | 0 | 0 | 0 | 1 | 1 |
| 05 | 0 | 0 | 0 | 0 | 0 | 1 | 0 | 1 | 04 | 0 | 0 | 0 | 0 | 0 | 1 | 0 | 0 |
| 06 | 0 | 0 | 0 | 0 | 0 | 1 | 1 | 0 | 05 | 0 | 0 | 0 | 0 | 0 | 1 | 0 | 1 |
| 07 | 0 | 0 | 0 | 0 | 0 | 1 | 1 | 1 | 06 | 0 | 0 | 0 | 0 | 0 | 1 | 1 | 0 |
| 08 | 0 | 0 | 0 | 0 | 1 | 0 | 0 | 0 | 07 | 0 | 0 | 0 | 0 | 0 | 1 | 1 | 1 |
| 09 | 0 | 0 | 0 | 0 | 1 | 0 | 0 | 1 | 08 | 0 | 0 | 0 | 0 | 1 | 0 | 0 | 0 |
| 0A | 0 | 0 | 0 | 0 | 1 | 0 | 1 | 0 | 09 | 0 | 0 | 0 | 0 | 1 | 0 | 0 | 1 |
| 0B | 0 | 0 | 0 | 0 | 1 | 0 | 1 | 1 | 0A | 0 | 0 | 0 | 0 | 1 | 0 | 1 | 0 |
| 0C | 0 | 0 | 0 | 0 | 1 | 1 | 0 | 0 | 0B | 0 | 0 | 0 | 0 | 1 | 0 | 1 | 1 |
| 0D | 0 | 0 | 0 | 0 | 1 | 1 | 0 | 1 | 0C | 0 | 0 | 0 | 0 | 1 | 1 | 0 | 0 |
| 0E | 0 | 0 | 0 | 0 | 1 | 1 | 1 | 0 | 0D | 0 | 0 | 0 | 0 | 1 | 1 | 0 | 1 |
| 0F | 0 | 0 | 0 | 0 | 1 | 1 | 1 | 1 | 0E | 0 | 0 | 0 | 0 | 1 | 1 | 1 | 0 |
| 10 | 0 | 0 | 0 | 1 | 0 | 0 | 0 | 0 | 00 | 0 | 0 | 0 | 0 | 0 | 0 | 0 | 0 |
| 11 | 0 | 0 | 0 | 1 | 0 | 0 | 0 | 1 | 10 | 0 | 0 | 0 | 1 | 0 | 0 | 0 | 0 |
| 12 | 0 | 0 | 0 | 1 | 0 | 0 | 1 | 0 | 11 | 0 | 0 | 0 | 1 | 0 | 0 | 0 | 1 |
| 13 | 0 | 0 | 0 | 1 | 0 | 0 | 1 | 1 | 12 | 0 | 0 | 0 | 1 | 0 | 0 | 1 | 0 |
| 14 | 0 | 0 | 0 | 1 | 0 | 1 | 0 | 0 | 13 | 0 | 0 | 0 | 1 | 0 | 0 | 1 | 1 |
| 15 | 0 | 0 | 0 | 1 | 0 | 1 | 0 | 1 | 14 | 0 | 0 | 0 | 1 | 0 | 1 | 0 | 0 |
| 16 | 0 | 0 | 0 | 1 | 0 | 1 | 1 | 0 | 15 | 0 | 0 | 0 | 1 | 0 | 1 | 0 | 1 |
| 17 | 0 | 0 | 0 | 1 | 0 | 1 | 1 | 1 | 16 | 0 | 0 | 0 | 1 | 0 | 1 | 1 | 1 |
| 18 | 0 | 0 | 0 | 1 | 1 | 0 | 0 | 0 | 17 | 0 | 0 | 0 | 1 | 0 | 1 | 1 | 1 |
| 19 | 0 | 0 | 0 | 1 | 1 | 0 | 0 | 1 | 18 | 0 | 0 | 0 | 1 | 1 | 0 | 0 | 0 |
| 1A | 0 | 0 | 0 | 1 | 1 | 0 | 1 | 0 | 19 | 0 | 0 | 0 | 1 | 1 | 0 | 0 | 1 |
| 1B | 0 | 0 | 0 | 1 | 1 | 0 | 1 | 1 | 1A | 0 | 0 | 0 | 1 | 1 | 0 | 1 | 0 |
| 1C | 0 | 0 | 0 | 1 | 1 | 1 | 0 | 0 | 1B | 0 | 0 | 0 | 1 | 1 | 0 | 1 | 1 |
| 1D | 0 | 0 | 0 | 1 | 1 | 1 | 0 | 1 | 1C | 0 | 0 | 0 | 1 | 1 | 1 | 0 | 0 |
| 1E | 0 | 0 | 0 | 1 | 1 | 1 | 1 | 0 | 1D | 0 | 0 | 0 | 1 | 1 | 1 | 0 | 1 |
| 1F | 0 | 0 | 0 | 1 | 1 | 1 | 1 | 1 | 1E | 0 | 0 | 0 | 1 | 1 | 1 | 1 | 0 |
| | | | | | | CONTROL STATE "01" | | | | | | | | | | | |
| 40 | 0 | 1 | 0 | 0 | 0 | 0 | 0 | 0 | 01 | 0 | 0 | 0 | 0 | 0 | 0 | 0 | 1 |
| 41 | 0 | 1 | 0 | 0 | 0 | 0 | 0 | 1 | 41 | 0 | 1 | 0 | 0 | 0 | 0 | 0 | 1 |
| 42 | 0 | 1 | 0 | 0 | 0 | 0 | 1 | 0 | 2F | 0 | 0 | 1 | 0 | 1 | 1 | 1 | 1 |
| 43 | 0 | 1 | 0 | 0 | 0 | 0 | 1 | 1 | 01 | 0 | 0 | 0 | 0 | 0 | 0 | 0 | 1 |
| 44 | 0 | 1 | 0 | 0 | 0 | 1 | 0 | 0 | 03 | 0 | 0 | 0 | 0 | 0 | 0 | 1 | 1 |
| 45 | 0 | 1 | 0 | 0 | 0 | 1 | 0 | 1 | 04 | 0 | 0 | 0 | 0 | 0 | 1 | 0 | 0 |
| 46 | 0 | 1 | 0 | 0 | 0 | 1 | 1 | 0 | 05 | 0 | 0 | 0 | 0 | 0 | 1 | 0 | 1 |
| 47 | 0 | 1 | 0 | 0 | 0 | 1 | 1 | 1 | 06 | 0 | 0 | 0 | 0 | 0 | 1 | 1 | 0 |
| 48 | 0 | 1 | 0 | 0 | 1 | 0 | 0 | 0 | 07 | 0 | 0 | 0 | 0 | 0 | 1 | 1 | 1 |
| 49 | 0 | 1 | 0 | 0 | 1 | 0 | 0 | 1 | 08 | 0 | 0 | 0 | 0 | 1 | 0 | 0 | 0 |
| 4A | 0 | 1 | 0 | 0 | 1 | 0 | 1 | 0 | 19 | 0 | 0 | 0 | 1 | 1 | 0 | 0 | 1 |
| 4B | 0 | 1 | 0 | 0 | 1 | 0 | 1 | 1 | 0A | 0 | 0 | 0 | 0 | 1 | 0 | 1 | 0 |
| 4C | 0 | 1 | 0 | 0 | 1 | 1 | 0 | 0 | 0B | 0 | 0 | 0 | 0 | 1 | 0 | 1 | 1 |
| 4D | 0 | 1 | 0 | 0 | 1 | 1 | 0 | 1 | 0C | 0 | 0 | 0 | 0 | 1 | 1 | 0 | 0 |
| 4E | 0 | 1 | 0 | 0 | 1 | 1 | 1 | 0 | 0D | 0 | 0 | 0 | 0 | 1 | 1 | 0 | 1 |
| 4F | 0 | 1 | 0 | 0 | 1 | 1 | 1 | 1 | 0E | 0 | 0 | 0 | 0 | 1 | 1 | 1 | 0 |
| 50 | 0 | 1 | 0 | 1 | 0 | 0 | 0 | 0 | 01 | 0 | 0 | 0 | 0 | 0 | 0 | 0 | 1 |
| 51 | 0 | 1 | 0 | 1 | 0 | 0 | 0 | 1 | 01 | 0 | 0 | 0 | 0 | 0 | 0 | 0 | 1 |
| 52 | 0 | 1 | 0 | 1 | 0 | 0 | 1 | 0 | 01 | 0 | 0 | 0 | 0 | 0 | 0 | 0 | 1 |
| 53 | 0 | 1 | 0 | 1 | 0 | 0 | 1 | 1 | 01 | 0 | 0 | 0 | 0 | 0 | 0 | 0 | 1 |
| 54 | 0 | 1 | 0 | 1 | 0 | 1 | 0 | 0 | 01 | 0 | 0 | 0 | 0 | 0 | 0 | 0 | 1 |
| 55 | 0 | 1 | 0 | 1 | 0 | 1 | 0 | 1 | 01 | 0 | 0 | 0 | 0 | 0 | 0 | 0 | 1 |
| 56 | 0 | 1 | 0 | 1 | 0 | 1 | 1 | 0 | 01 | 0 | 0 | 0 | 0 | 0 | 0 | 0 | 1 |
| 57 | 0 | 1 | 0 | 1 | 0 | 1 | 1 | 1 | 01 | 0 | 0 | 0 | 0 | 0 | 0 | 0 | 1 |
| 58 | 0 | 1 | 0 | 1 | 1 | 0 | 0 | 0 | 01 | 0 | 0 | 0 | 0 | 0 | 0 | 0 | 1 |
| 59 | 0 | 1 | 0 | 1 | 1 | 0 | 0 | 1 | 01 | 0 | 0 | 0 | 0 | 0 | 0 | 0 | 1 |
| 5A | 0 | 1 | 0 | 1 | 1 | 0 | 1 | 0 | 01 | 0 | 0 | 0 | 0 | 0 | 0 | 0 | 1 |

TABLE II-continued

| | A8 | A7 | A6 | A5 | A4 | A3 | A2 | A1 | | Q8 | Q7 | Q6 | Q5 | Q4 | Q3 | Q2 | Q1 |
|---|---|---|---|---|---|---|---|---|---|---|---|---|---|---|---|---|---|
| 5B | 0 | 1 | 0 | 1 | 1 | 0 | 1 | 1 | 01 | 0 | 0 | 0 | 0 | 0 | 0 | 0 | 1 |
| 5C | 0 | 1 | 0 | 1 | 1 | 1 | 0 | 0 | 01 | 0 | 0 | 0 | 0 | 0 | 0 | 0 | 1 |
| 5D | 0 | 1 | 0 | 1 | 1 | 1 | 0 | 1 | 01 | 0 | 0 | 0 | 0 | 0 | 0 | 0 | 1 |
| 5E | 0 | 1 | 0 | 1 | 1 | 1 | 1 | 0 | 01 | 0 | 0 | 0 | 0 | 0 | 0 | 0 | 1 |
| 5F | 0 | 1 | 0 | 1 | 1 | 1 | 1 | 1 | 01 | 0 | 0 | 0 | 0 | 0 | 0 | 0 | 1 |
| | | | | | | | | | CONTROL STATE "10" | | | | | | | | |
| 80 | 1 | 0 | 0 | 0 | 0 | 0 | 0 | 0 | 02 | 0 | 0 | 0 | 0 | 0 | 0 | 1 | 0 |
| 81 | 1 | 0 | 0 | 0 | 0 | 0 | 0 | 1 | 1F | 0 | 0 | 0 | 1 | 1 | 1 | 1 | 1 |
| 82 | 1 | 0 | 0 | 0 | 0 | 0 | 1 | 0 | 82 | 1 | 0 | 0 | 0 | 0 | 0 | 1 | 0 |
| 83 | 1 | 0 | 0 | 0 | 0 | 0 | 1 | 1 | 02 | 0 | 0 | 0 | 0 | 0 | 0 | 1 | 0 |
| 84 | 1 | 0 | 0 | 0 | 0 | 1 | 0 | 0 | 03 | 0 | 0 | 0 | 0 | 1 | 0 | 1 | 1 |
| 85 | 1 | 0 | 0 | 0 | 0 | 1 | 0 | 1 | 04 | 0 | 1 | 0 | 0 | 0 | 1 | 0 | 0 |
| 86 | 1 | 0 | 0 | 0 | 0 | 1 | 1 | 0 | 05 | 0 | 0 | 0 | 0 | 0 | 1 | 0 | 1 |
| 87 | 1 | 0 | 0 | 0 | 0 | 1 | 1 | 1 | 06 | 0 | 0 | 0 | 0 | 0 | 1 | 1 | 0 |
| 88 | 1 | 0 | 0 | 0 | 1 | 0 | 0 | 0 | 07 | 0 | 0 | 0 | 0 | 0 | 1 | 1 | 1 |
| 89 | 1 | 0 | 0 | 0 | 1 | 0 | 0 | 1 | 08 | 0 | 0 | 0 | 0 | 1 | 0 | 0 | 0 |
| 8A | 1 | 0 | 0 | 0 | 1 | 0 | 1 | 0 | 09 | 0 | 0 | 0 | 0 | 1 | 0 | 0 | 1 |
| 8B | 1 | 0 | 0 | 0 | 1 | 0 | 1 | 1 | 0A | 0 | 0 | 0 | 0 | 0 | 0 | 1 | 0 |
| 8C | 1 | 0 | 0 | 0 | 1 | 1 | 0 | 0 | 0B | 0 | 0 | 0 | 0 | 0 | 0 | 1 | 1 |
| 8D | 1 | 0 | 0 | 0 | 1 | 1 | 0 | 1 | 0C | 0 | 0 | 0 | 0 | 1 | 0 | 0 | 0 |
| 8E | 1 | 0 | 0 | 0 | 1 | 1 | 1 | 0 | 0D | 0 | 0 | 0 | 0 | 0 | 1 | 0 | 1 |
| 8F | 1 | 0 | 0 | 0 | 1 | 1 | 1 | 1 | 0E | 0 | 0 | 0 | 0 | 0 | 1 | 1 | 0 |
| 90 | 1 | 0 | 0 | 1 | 0 | 0 | 0 | 0 | 02 | 0 | 0 | 0 | 0 | 0 | 0 | 1 | 0 |
| 91 | 1 | 0 | 0 | 1 | 0 | 0 | 0 | 1 | 00 | 0 | 0 | 0 | 0 | 0 | 0 | 0 | 0 |
| 92 | 1 | 0 | 0 | 0 | 0 | 0 | 1 | 0 | 11 | 0 | 0 | 0 | 1 | 0 | 0 | 0 | 1 |
| 93 | 1 | 0 | 0 | 1 | 0 | 0 | 1 | 1 | 12 | 0 | 0 | 0 | 1 | 0 | 0 | 1 | 0 |
| 94 | 1 | 0 | 0 | 1 | 0 | 1 | 0 | 0 | 13 | 0 | 0 | 0 | 1 | 0 | 0 | 1 | 1 |
| 95 | 1 | 0 | 0 | 1 | 0 | 1 | 0 | 1 | 14 | 0 | 0 | 0 | 1 | 0 | 1 | 0 | 0 |
| 96 | 1 | 0 | 0 | 1 | 0 | 1 | 1 | 0 | 15 | 0 | 0 | 0 | 1 | 0 | 1 | 0 | 1 |
| 97 | 1 | 0 | 0 | 1 | 0 | 1 | 1 | 1 | 16 | 0 | 0 | 0 | 1 | 0 | 1 | 1 | 0 |
| 98 | 1 | 0 | 0 | 1 | 1 | 0 | 0 | 0 | 17 | 0 | 0 | 0 | 1 | 0 | 1 | 1 | 1 |
| 99 | 1 | 0 | 0 | 1 | 1 | 0 | 0 | 1 | 18 | 0 | 0 | 0 | 1 | 1 | 0 | 0 | 0 |
| 9A | 1 | 0 | 0 | 1 | 1 | 0 | 1 | 0 | 19 | 0 | 0 | 0 | 1 | 1 | 0 | 0 | 1 |
| 9B | 1 | 0 | 0 | 1 | 1 | 0 | 1 | 1 | 1A | 0 | 0 | 0 | 1 | 1 | 0 | 1 | 0 |
| 9C | 1 | 0 | 0 | 1 | 1 | 1 | 0 | 0 | 1B | 0 | 0 | 0 | 1 | 1 | 0 | 1 | 1 |
| 9D | 1 | 0 | 0 | 1 | 1 | 1 | 0 | 1 | 1C | 0 | 0 | 0 | 1 | 1 | 1 | 0 | 0 |
| 9E | 1 | 0 | 0 | 1 | 1 | 1 | 1 | 0 | 1D | 0 | 0 | 0 | 1 | 1 | 1 | 0 | 1 |
| 9F | 1 | 0 | 0 | 1 | 1 | 1 | 1 | 1 | 1E | 0 | 0 | 0 | 1 | 1 | 1 | 1 | 0 |

Table IIA gives the lower sixteen values for the condition where A+ =0 and A− =0, i.e., address inputs A8 and A7 to PROM 110 are both "0". Table IIB gives the lower sixteen values for the condition where A+ =0 and A− =1, i.e., address inputs A8 and A7 are "0" and "1" respectively. Table IIC gives the lower sixteen values for the condition where A+ =1 and A− =0, i.e., address inputs A8 and A7 are "1" and "0", respectively.

Assume initially that A8 and A7 are both "0" and that A6 to A1 from the latch circuits are also all "0". This PROM address corresponds to the top line in Table IIA and results in a PROM output "00" in hexadecimal or "00000000" in binary. Upon occurrence of a clock pulse, the PROM output is transferred to the latch output. Outputs Q8 and Q7 are both "0" and therefore A'+ =0 and A'− =0. As a result transistors QA+ and QA− =0. As a result transistors QA+ and QA− are both off. Latch outputs Q6 to Q1 are "000000" binary and these outputs are supplied to PROM address inputs A6 to A1. Thus, so long as A8 and A7 are both "0", the input to the PROM remains "00000000" and Q8 and Q7 from the latch circuits maintains both transistors turned off.

If the signals from the motor controller 105 now change so that A8 remains "0" but A7 becomes "1", the PROM address becomes "01000000" (40 hexadecimal) which appears on the top line of Table IIB. The PROM output becomes "00000001" and, after the next clock pulse, the six least significant bits are transferred to the PROM address inputs so that the address input becomes "01000001" (41 hexadecimal) corresponding to the second line on Table IIB. This results in a PROM output "01000001" (41 hexadecimal) and, after the next clock pulse, the latch outputs include Q8=0 and Q7=1 thereby maintaining transistor QA+ turned off and transistor QA− turned on. Since the PROM output (A1 hexadecimal) is the same as the PROM address, the system remains locked in at this address until the next change in A8, A7.

Assume next that the signals from the motor controller change so that A8 becomes "1" and A7 becomes "0", a transition which could result in both transistors of a series pair being momentarily conductive. According to the invention, this transition is detected and an appropriate time delay is provided to delay the turn on of transistor QA+ sufficiently for transistor QA− to turn off. When the motor controller signals become A8=1 and A7=0, the PROM address changes to "10000001" (81 hexadecimal) resulting in a PROM output "00011111" (1F hexadecimal). On the next clock pulse Q8=0 and Q7=0 and therefore both transistors receive a "0" (turn-off) signals. The lower six bits of the latch output, "011111" are supplied to the PROM address which then becomes "10011111" (9F hexadecimal) as appears in the bottom line of Table IIC. The PROM output then becomes "00011110" (1E hexadecimal). After the next clock pulse the lower six bits are supplied to the PROM address which therefore moves up one line in Table IIC. The values in Table IIC are such that each successive clock pulse moves the address up one line on the table and maintains the values Q8=0 and Q7=0 so that both transistors receive a turn-off signal. Thus, both transistors receive turn-off signals during fifteen clock pulses as the address works up the table until reaching address 91 (hexadecimal) corresponding to a PROM output "00000000". Transfer of the lower six bits to the address input on occurrence of the next clock pulse results in an address "10000000" (80 hexadecimal) on the top line of Table IIC. The PROM output becomes "00000010" (02 hexadecimal) and, after the next clock pulse, the PROM address changes to "10000010" (82 hexadecimal). At this point the PROM output is the same as the PROM address and therefore the system locks in at this location until A7 or A8 changes. Since Q8=1 and Q7=0 at this location, transistor QA+ begins to receive the time delayed turn-on signal.

If the command state changes from "01" (i.e., A+ =0 and A− =1) to "00" (a transition which does not result in an overlap of transistor conduction states) and then to "10" (a condition which could result in an overlap of transistor conduction states), the system nonetheless provides the necessary time delay. In command state "01" the address is 41 (hexadecimal). If the command state changes to "00", the PROM address changes to 01 (hexadecimal) and then to 1F (hexadecimal) to begin the fifteen step counting sequence. If, for example, after five counts (at address "1B" in Table IIA), the command changes to "10", the PROM address changes to "9B" on Table IIC and the fifteen step count continues. Thus, a turn-on signal is not supplied to the series transistor in less than fifteen counts (15 microseconds) after turn-off of the other series transistor.

While the invention has been described in its preferred embodiments it is to be understood that the words which have been used are words of description rather than limitation and that changes may be made within the purview of the appended claims without departing from the true scope and spirit of the invention in its broader aspects.

What is claimed is:

1. A motor control system comprising:
an electric motor which includes a stator having windings and a rotor;
commutation control means, responsive to the position of said rotor relative to said stator for providing output signals;
series connected transistor pairs connected between terminals of a power supply for applying electric currents to the windings of said motor;
protection circuit means for each of said transistor pairs, responsive to said output signals from said commutation control means for providing delayed control signals to the associated series transistor pair which under conditions that would otherwise cause simultaneous conduction of said series connected transistors, and wherein said protection circuit operates according to a comparison of the present state of said output signals to their previous state.

2. A motor control system according to claim 1 wherein said protection circuit means includes a read only memory.

3. A motor control system according to claim 2 further comprising a source of timing signals for controlling the delay between said output signals and said control signals.

4. A motor control system according to claim 3 wherein said series connected transistor pairs include two transistors having their bases coupled to said circuit protection means, the collector of a first transistor connected to a first terminal of a power supply, the emitter of the first transistor connected to the collector of the second transistor, and the emitter of the second transmitter connected to a second terminal of said supply.

5. A motor control system according to claim 4 including at least three of said series connected transistor pairs.

6. A motor control system according to claim 5 including protection circuit means corresponding to each pair of series connected transistor pairs.

7. A protection circuit for preventing simultaneous conduction of a series connected transistor pair connected between terminals of a power supply, the series connected transistors being controlled according to output signals from a controller, comprising:
a read only memory with parallel memory addressing inputs and parallel memory outputs;
a set of latching circuits
including a separate latching circuit associated with each of said parallel memory outputs, and
being operable to provide parallel latch outputs;
circuit means
coupling control signals for controlling the conductive state of the transistors of said transistor pair to two of said memory addressing inputs,
coupling two of said latch outputs to control the conductive state of the transistor of the transistor pair, and
coupling the remaining of said latch outputs to the remaining of said memory addressing inputs, and
a clock coupled to said set of latching circuits to periodically transfer input states of said latching circuits to said parallel latch outputs.

8. A protection circuit according to claim 7 wherein said read only memory is programmed
to detect conditions that could cause simultaneous conduction of transistors of a transistor pair, and
to provide a delay up to a predetermined number of clock counts when said simultaneous conduction conditions exist.

9. A protection circuit according to claim 8 wherein said delay is provided by a numerical stepping sequence in the program of said read only memory.

* * * * *